United States Patent [19]
Solal et al.

[11] Patent Number: 5,703,427
[45] Date of Patent: Dec. 30, 1997

[54] SURFACE-WAVE DISTRIBUTED ACOUSTIC REFLECTION TRANSDUCER AND FILTER INCLUDING SUCH A TRANSDUCER

[75] Inventors: Marc Solal, Antibes; Pascal Ventura; Jean-Michel Hode, both of Valbonne, all of France

[73] Assignee: Thomson-CSF, Paris, France

[21] Appl. No.: 730,173

[22] Filed: Oct. 15, 1996

Related U.S. Application Data

[63] Continuation of Ser. No. 338,448, filed as PCT/FR94/00240, Mar. 4, 1994 published as WO94/22217, Sep. 29, 1994, abandoned.

[30] Foreign Application Priority Data

Mar. 19, 1993 [FR] France ................. 93 03205

[51] Int. Cl.$^6$ .................................... H03H 9/145
[52] U.S. Cl. ............... 310/313 D; 333/154; 333/195
[58] Field of Search .................... 310/313 D; 333/154, 333/195

[56] References Cited

U.S. PATENT DOCUMENTS

| | | | |
|---|---|---|---|
| 4,281,301 | 7/1981 | Stevens et al. | 333/195 |
| 4,910,839 | 3/1990 | Wright | 29/25.35 |
| 5,051,644 | 9/1991 | Wright | 310/313 B |
| 5,061,871 | 10/1991 | Wright | 310/313 B |
| 5,162,689 | 11/1992 | Fliegel et al. | 310/313 B |
| 5,212,420 | 5/1993 | Hickernell et al. | 310/313 D |
| 5,264,751 | 11/1993 | Dufilie et al. | 310/313 B |
| 5,270,606 | 12/1993 | Cho et al. | 310/313 D |
| 5,274,345 | 12/1993 | Gau | 333/153 |
| 5,438,306 | 8/1995 | Yamanouchi et al. | 333/195 |
| 5,550,793 | 8/1996 | Dufilie | 310/313 D |

FOREIGN PATENT DOCUMENTS

| | | | |
|---|---|---|---|
| 2641090 | 3/1987 | Germany | 333/195 |
| 0236312 | 11/1985 | Japan | 310/313 D |
| 0263505 | 12/1985 | Japan | 333/195 |
| 0220513 | 9/1986 | Japan | 333/195 |
| 0194406 | 8/1988 | Japan | 333/195 |
| 0283309 | 11/1988 | Japan | 333/195 |
| 0270416 | 11/1990 | Japan | 333/195 |
| 3128517 | 5/1991 | Japan | 333/195 |

OTHER PUBLICATIONS

"900MHz Range Wideband Double Mode SAW Filters" by T. Morita et al., May 28, 1992.

"New Types of SAW Reflectors and Resonators Consisting of Reflecting Elements with Positive and Negative Reflection".

"Coefficients" by M. Takeuchi et al., IEEE Transactions on Ultrasonics, Ferroelectrics, and Frequency Control, Jul. 4, 1986.

*Primary Examiner*—Thomas M. Dougherty
*Attorney, Agent, or Firm*—Oblon, Spivak, McClelland, Maier & Neustadt, P.C.

[57] ABSTRACT

The distributed acoustic reflection transducer has a reflection function which includes at least one reversal of sign, that is to say it possesses at least one reflector and, in general, a combination of reflectors, the center of which is at a distance of $k\lambda/2+\lambda/4$ from the center of the other reflectors, $\lambda$ being the wavelength corresponding to the central operating frequency of the transducer.

The applications will be for the production of surface-wave filters in radio communication systems.

8 Claims, 7 Drawing Sheets

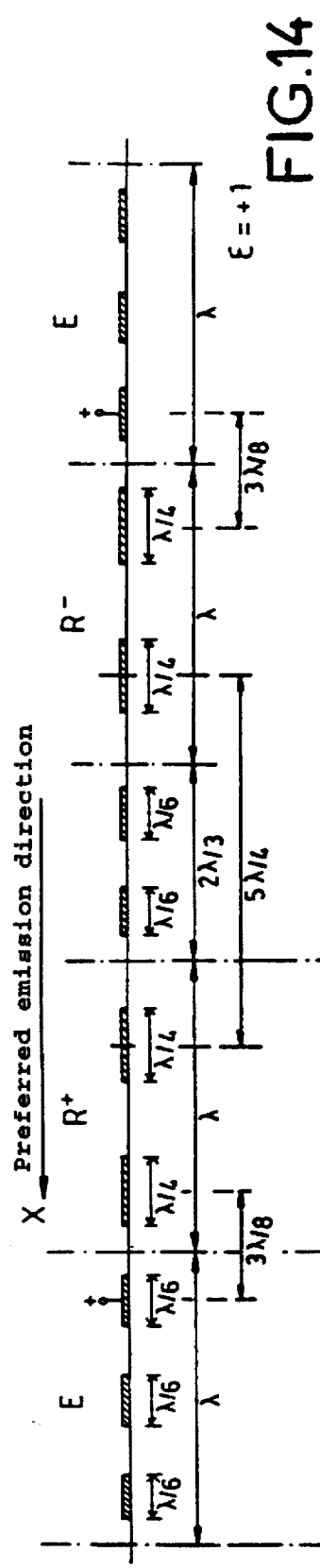
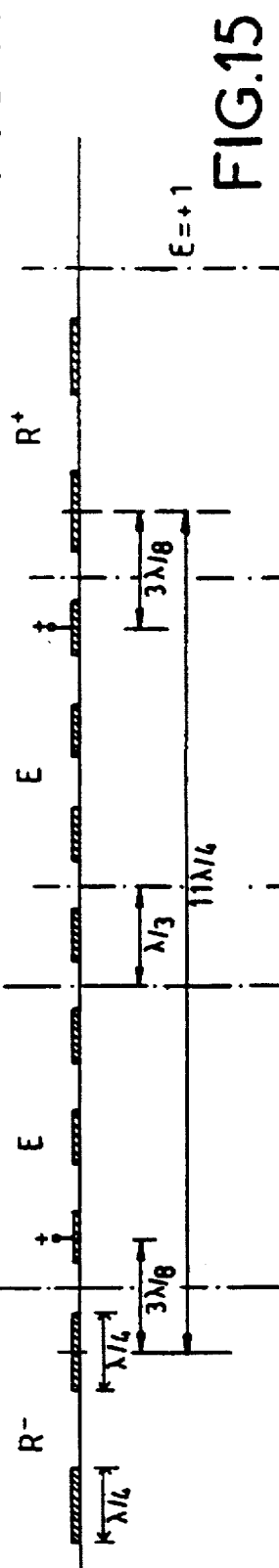
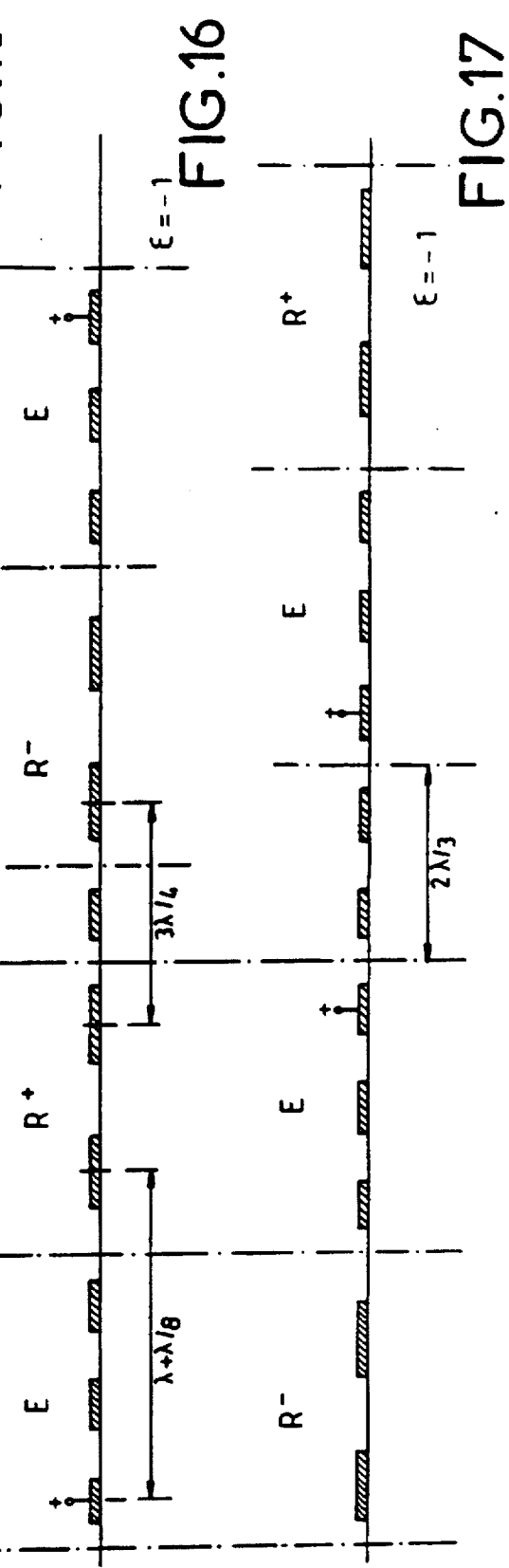

SURFACE-WAVE DISTRIBUTED ACOUSTIC REFLECTION TRANSDUCER AND FILTER INCLUDING SUCH A TRANSDUCER

This application is a continuation of application Ser. No. 08/338,448, filed on Nov. 21, 1994, now abandoned; which is a 371 application of PCT/FR94/00240 filed on Mar. 4, 1994 published as WO94/22217, Sep. 29, 1994.

BACKGROUND OF THE INVENTION

1. Field of the Invention

The invention relates to a surface-wave distributed acoustic reflection transducer and a filter including such a transducer.

2. Discussion of Background

Transducers and filters of this type are commonly used in many fields, such as radars or mobile radio communication systems, for example for intermediate-frequency filtering.

The embodiment of surface-wave filters of the type having resonant cavities and two poles, including an acoustic channel whose bidirectional transducers are separated by a reflecting central array, is known.

According to an alternative embodiment, a parallel arrangement of similar acoustic channels is also known in which the transducers are offset from one channel to another in such a way that the vector sum of the direct-path waves becomes zero.

Finally, a third alternative is the use of distributed acoustic reflection transducers, also known by the name DART, instead of the conventional transducers. By juxtaposing emitting and reflecting cells, these transducers emit the greater part of their energy in a preferred direction, this making it possible to obtain low losses. Thus, transducers are produced which use cells of the EWC (Electrode Width Control) type, reflecting cells having two reflectors of width $\lambda/4$ per wavelength, where $\lambda$ is the wavelength corresponding to the central operating frequency of the transducer or emitting cells having three electrodes of width $\lambda/6$ per wavelength such as those described, for example, in French Patent Application No. 2,653,632 filed by the Applicant Company. The transduction and emission cells in this type of transducer are arranged so as to obtain phase coherence between the waves emitted in the preferred direction of propagation and the waves propagating in this same direction after reflection.

Resonant-cavity filters allow only narrow relative passbands. The other two embodiment types do not permit the size of the filter to be optimized, whether in terms of length, because of the size of the transducers necessary for producing filtering, whether in terms of width, when several acoustic channels are joined together in order to improve the performance of the filter.

On the other hand, multiplication of the acoustic channels placed in parallel makes the manufacture of such components more complicated.

The object of the invention is to overcome the aforementioned drawbacks.

SUMMARY OF THE INVENTION

For this purpose, the subject of the invention is a surface-wave distributed acoustic reflection transducer (DART), characterized in that it includes at least one reversal of sign of the reflection function, that is to say it includes at least one reflector whose centre is at a distance of $k\lambda/2+\lambda/4$ from the centre of the other reflectors, $\lambda$ being the wavelength corresponding to the central operating frequency of the transducer and k being an integer.

In the DART embodiment, the matched spatial distribution of the cells according to the prior art and of the negative-reflection cells according to the invention makes it possible to produce filters of the resonant-cavity type formed from 2 DARTs; by increasing the number of folded-up paths along the axis of propagation, the equivalent of small resonant cavities actually within a DART is created.

The advantages of the invention essentially relate to the dimensions of the component and to the cost of producing it. The filters according to the invention give, with a smaller size, performance which is equivalent to, if not better than, that of a filter according to the prior art. They are simpler to produce because of the fact that placing acoustic channels in parallel is not necessary.

By way of example, it is possible to produce filters according to the invention in which the length is 20 to 30% shorter and the insertion losses are 15% less and the variations in the group propagation time reduced by half compared to a filter of the same characteristic according to the prior art.

BRIEF DESCRIPTION OF THE DRAWINGS

The invention will be well understood and its advantages and other characteristics will emerge from the following description of a few non-limiting embodiment examples, with reference to the appended diagrammatic drawings in which:

FIGS. 14 to 17 depict the embodiment of transition zones using emitting cells having three electrodes per wavelength.

DETAILED DESCRIPTION OF THE PREFERRED EMBODIMENTS

Figure 1:
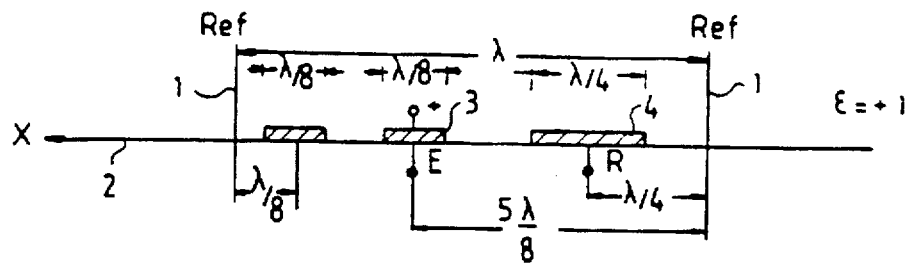
FIGS. 1 and 2 are sectional views of an EWC-type cell according to the prior art.
Figure 2:
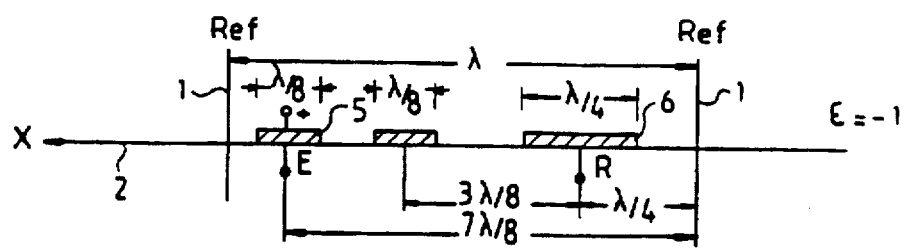

Referring to FIGS. 1 and 2, in which, as in the following figures, equivalent elements are identified by the same references, cells according to the prior art known by the name EWC are depicted, each including a reflector and a source. The boundaries or references 1 of these cells of length $\lambda$, which are conventional and therefore have no physical reality, have been positioned here so that they correspond to the references chosen for the novel cells according to the invention.

The preferred direction of propagation of the acoustic wave in a DART using this type of cell is the direction of the axis X. $\epsilon$ defines the sign of the $\lambda/4$ path difference of the waves reflected from a reflector and depends on the physical properties of the materials of which the filter is composed. FIG. 1 describes an EWC-type cell for the case where $\epsilon=+1$ in which the reflection takes place with a path difference of $+\lambda/4$ and FIG. 2 a cell for the case where $\epsilon=-1$ in which the reflection takes place with a path difference of $-\lambda/4$.

The waves emitted and reflected in the preferred direction of propagation X are in phase and the cells are called positive-reflection cells. The phase references of the transducers 3 and 5 and of the reflectors 4 and 6 are respectively identified by the letters E and R.

Figure 3:
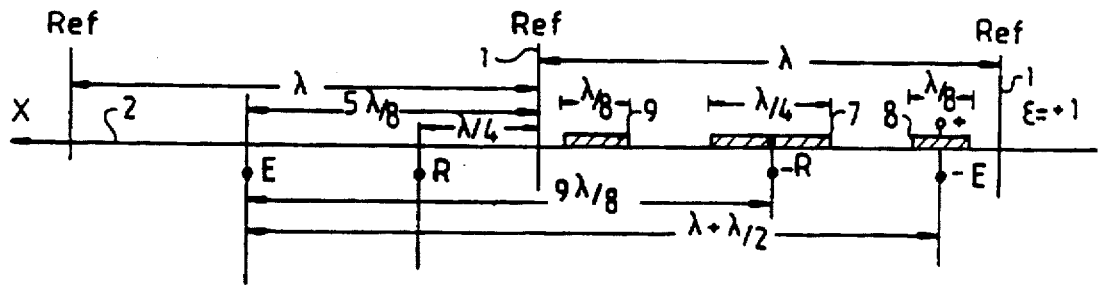
FIGS. 3, 4, 5 are sectional views of cells for the DART embodiment or filters according to the invention.

These references are repeated in FIG. 3 which depicts a cell according to the invention for a filter, the materials of which correspond to a coefficient $\epsilon=+1$. This cell of length $\lambda$ possesses a reflecting electrode 7 of width $\lambda/4$ at its centre and two electrodes 8 and 9 of width $\lambda/8$, the centres of which are at a distance of $3\lambda/8$ from the centre of the reflecting electrode 7 and of which the right-hand electrode 8 is connected to the input signal source.

The waves sent back by the reflector 7 in the direction X are in phase opposition with respect to the waves emitted or reflected in this preferred direction X by the emitting or reflecting cells of the known type of the same substrate since the path difference with respect to the waves emitted in the direction X through a centre of transduction E is $$9\lambda/8+\lambda/4+9\lambda/8+k\lambda=\lambda/2+k\lambda$$

The electrode 8 at the input signal source emits waves in the preferred direction X in phase opposition with respect to the transducers of emitting cells of known type, its centre being at a distance of $k\lambda+\lambda/2$ from a centre of transduction E.

The left-hand electrode 9 makes it possible to cancel out the reflection from the electrode 8 and, moreover, contributes to the source for the case where a live electrode is affixed to the cell.

The cell is thus called –R –E, by similarity with the name E R of the EWC cell depicted in FIG. 1, and is called a negative-reflection cell because of the fact that the waves reflected by the reflector from this cell are in phase opposition with respect to the waves emitted or reflected by the positive-reflection cells of the prior art in the preferred direction X of propagation of the wave.

Figure 4:
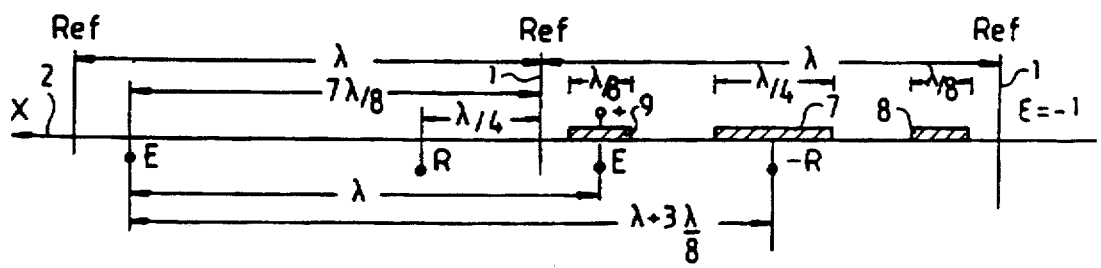

FIG. 4 describes a cell embodiment according to the invention when the materials used for the filter correspond to a coefficient of $\epsilon=-1$.

In this case, the left-hand electrode 9, and no longer the right-hand one 8, is connected to the source, thus making it possible to emit waves in phase with the waves transmitted in the preferred direction X by the positive-reflection cells of the prior art. This negative-reflection cell is called an E –R cell, since the path difference between the waves reflected in the direction X and those emitted by a centre of transduction E in this same direction is $3\lambda/8 - \lambda/4 + 3\lambda/8 + k\lambda = \lambda/2 + k\lambda$.

Figure 5:
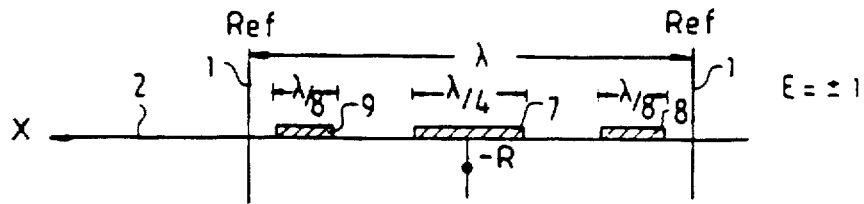

FIG. 5 also depicts a negative-reflection cell called a –R cell since it does not possess a transducer and can be used regardless of the type of materials constituting the filter. The reflection electrode 7 of width $\lambda/4$ is placed at the centre of the cell, the 2 electrodes 8 and 9 of width $\lambda/8$, the centres of which are at a distance of $3\lambda/8$ from the centre of the cell, contribute to the sources, for the case where the live electrodes are affixed to the cell, are compensated for as regards their reflection and make it possible to keep an approximately constant metallization ratio, for example in the region of 1/2.

In general, the cells according to the invention, called negative-reflection cells, are characterized in that, the axis of propagation X being oriented positively in the direction of movement of the resultant wave, as depicted in the figures, the algebraic distance between the position $x_E$ of the centre of transduction E of emitting cells according to the known art and the position $x_{-R}$ of the centre of reflection –R of these novel cells is:

$$d=x_E-x_{-R}=3\lambda/8+\lambda/4\pm k\lambda/2 \text{ for } \epsilon=+1$$

$$d=x_E-X_{-R}=5\lambda/8+\lambda/4\pm k\lambda/2 \text{ for } \epsilon=-1.$$

According to the alternative embodiment of the invention in FIG. 6, the interposition of a cell of length $\lambda/2$ downstream of cells of length $\lambda$, referring to the preferred direction of movement of the waves in the DART, makes it possible, while still keeping its reflection characteristics, to reverse the transduction sign of these cells as is explained hereinbelow.

Figure 6:
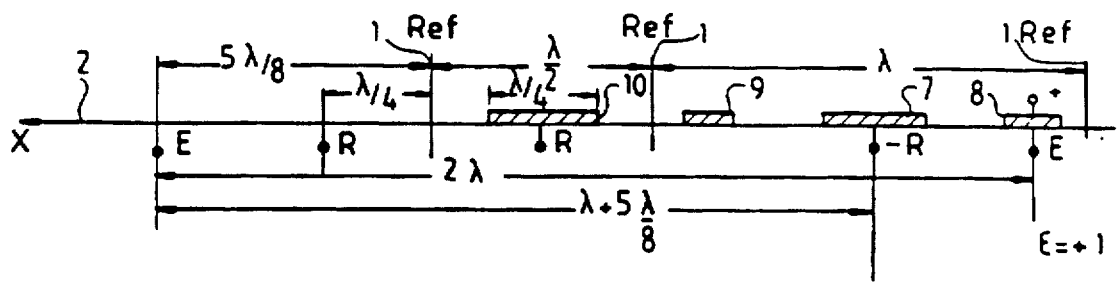
FIGS. 6 and 7 depict the embodiment of other cells according to the invention by juxtaposing cells of the previous type with reflecting cells of length $\lambda/2$.

FIG. 6 shows, for the case $\epsilon=+1$, the juxtaposition, on a substrate 2 and downstream of the –R –E cell as described in FIG. 3, of a novel cell, called a reflecting elementary cell, of width $\lambda/2$ and possessing a reflection electrode 10 of width $\lambda/4$ at its centre. The cell of width $\lambda$ consequently has the electrode 8 connected to the souce which emits in phase with a centre of transduction E placed downstream, since it is at a distance of $2\lambda+k\lambda$, and its reflector 7 which reflects the waves in phase opposition, since the path difference with the waves emitted in the preferred direction of propagation X is $5\lambda/8+5\lambda/8+\lambda/4=\lambda/2+k\lambda$. The joining of the novel cell of width $\lambda/2$, which may include a reflecting electrode at its centre downstream of the –R –E-type cell, thus gives a novel negative-reflection cell of –R E-type. A second elementary cell of width $\lambda/2$ should be placed upstream, still referring to the preferred direction of movement of the waves, if it is desired to re-establish the phases of the transducers of the emitting cells placed upstream.

Figure 7:
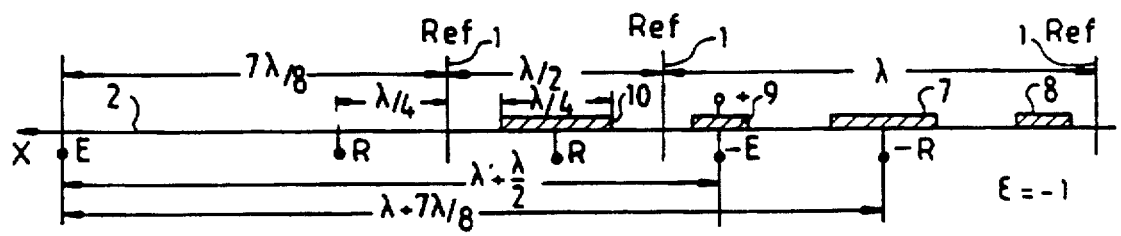

FIG. 7 shows the same construction when the materials of the filter correspond to $\epsilon=-1$. The elementary cell of width $\lambda/2$, which may include a reflecting electrode 10 at its centre, placed downstream of the E –R cell depicted in FIG. 4, makes it possible to transform this cell into an –E –R-type cell.

An alternative to the previously described cells consists in replacing the reflectors of width $\lambda/4$ by reflectors of width $3\lambda/8$. This electrode width makes it possible, when the metallization thickness is sufficiently great ($h/\lambda \geq 1.5\%$, where h is the metallization thickness and $\lambda$ is the wavelength at the central frequency), to obtain a greater reflection coefficient amplitude than for an electrode of width $\lambda/4$.

Figure 8:
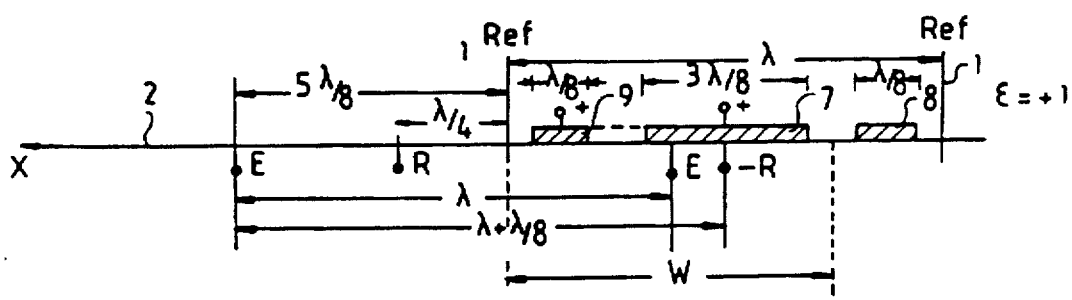
FIGS. 8 and 9 are an alternative embodiment of the previous 2 cells.

The use of adjacent cells of the elementary-cell type for the construction of –R E cells when $\epsilon=+1$ and of –E –R cells when $\epsilon=-1$ may be avoided by the use of novel cells. FIG. 8 depicts this novel cell of length $\lambda$ when $\epsilon=+1$. This cell is distinguished from those described previously in that the central electrode 7 has a width of $3\lambda/8$ and is connected to the source. It is flanked by 2 electrodes 8 and 9 of width $\lambda/8$, their centres being at a distance of $3\lambda/8$ from the centre of the cell, the left-hand electrode 9 also being connected to the live point.

The combination of the two electrodes 7 and 9 connected to the source behaves electrically approximately like a single electrode of width $5\lambda/8$. The centre of transduction of this single electrode is at its centre. This position corresponds to that of E type sources. Acoustically, reflections from the two outside electrodes 8 and 9 of the cell cancel each other out since their centres are $3\lambda/4$ apart and only the reflection from the reflecting electrode 7, which is at a distance of $3\lambda/4$ from a centre of reflection R, remains. This is thus a E –R cell.

The efficiency of the source is proportional to $\sin[\pi W/80]$ where W is the distance between the centres of the inter-electrode spaces. By construction, here, $W=3\lambda/4$ for downstream cells according to the invention, the assumption of FIG. 8.

The efficiency at the central frequency is therefore proportional to:

$$\sin[3\pi/4]=\sqrt{2}/2.$$

For the other cells, the space W is $W=\lambda/4$ and the efficiency is proportional to:

$$\sin[\pi/4]=\sqrt{2}/2.$$

The efficiency of the source for the E−R cell is therefore, to a first approximation, the same as that of the other sources.

Figure 9:
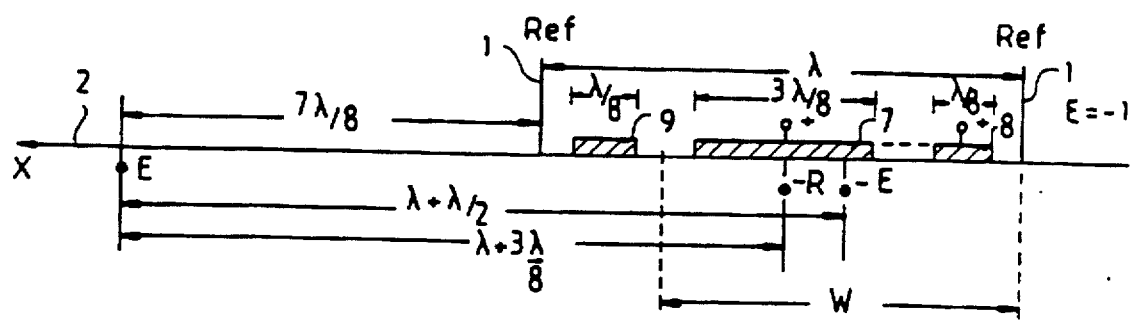

For materials giving a negative ε coefficient, as depicted in FIG. 9, it is the right-hand electrode 8, and no longer the left-hand electrode 9, which, at the same time as the central electrode 7 of width $3\lambda/8$, is connected to the live point.

The negative-reflection cell is of the −R −E type.

A $\lambda/48$ electrode shift will advantageously be used each time that the live electrode of a cell, as described previously, is surrounded by two non-equal spaces, this generally being the case when reflectors of width $\lambda/4$ are used.

The filters according to the invention use transducers of the DART type which include, for at least one of them, at least one negative-reflection cell.

The distribution and size of the zones which include positive-reflection cells according to the prior art and of the zones which include negative-reflection cells, as well as the choice of the cells of which these zones are composed, make it possible to obtain the transfer function as close as possible to that desired for a minimum size of the filter. The zone transitions correspond to a reversal of sign of the reflection coefficient.

Figure 10:
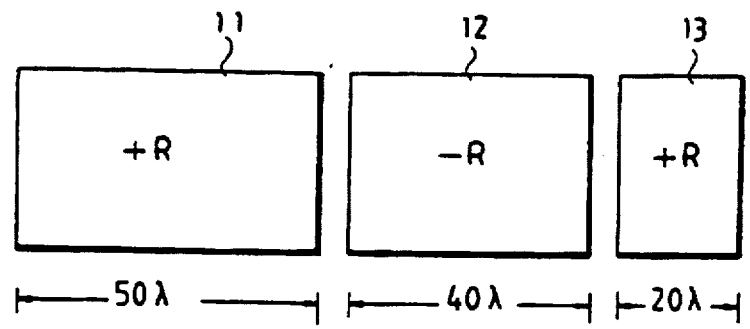
FIG. 10 depicts an example of the distribution of the cells of the prior art and of the invention in the embodiment of a DART, FIG. 11 plots the variation in the reflection coefficient of this DART along the axis of propagation of the waves, FIGS. 12 and 13 plot the transfer functions of a filter according to the prior art and of a filter according to the invention.

FIG. 10 is an embodiment example of a DART used in a filter according to the invention.

Its length is approximately $110\lambda$ and it is composed of 3 zones:

a zone 11 of approximately $50\lambda$ including positive-reflection cells, a zone 12 of approximately $40\lambda$ including negative-reflection cells, a zone 13 of approximately $20\lambda$ including positive-reflection cells.

Figure 11:
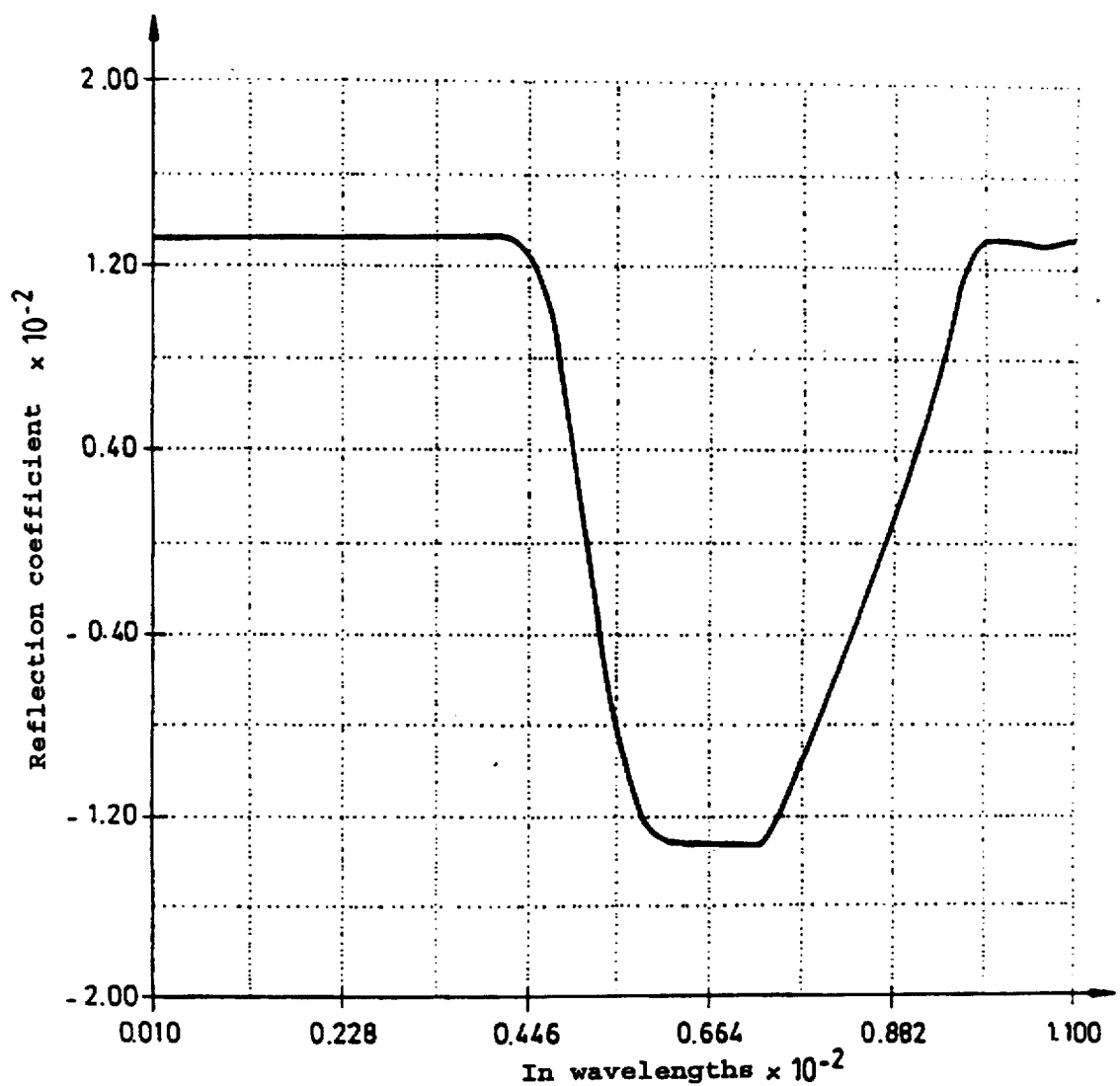

FIG. 11 shows the variation in the reflection coefficient of the DART as shown diagrammatically in FIG. 10 along the axis of propagation of the waves.

The axis of the abscissae depicts the axis of propagation of the wave in the DART; it is graduated into hundreds of a wavelength. The axis of the ordinates corresponds to the reflection coefficient of the waves and is graduated in hundredths. The reversal of sign of this coefficient takes place at approximately $50\lambda$ and $90\lambda$: zone transitions.

Figure 12:
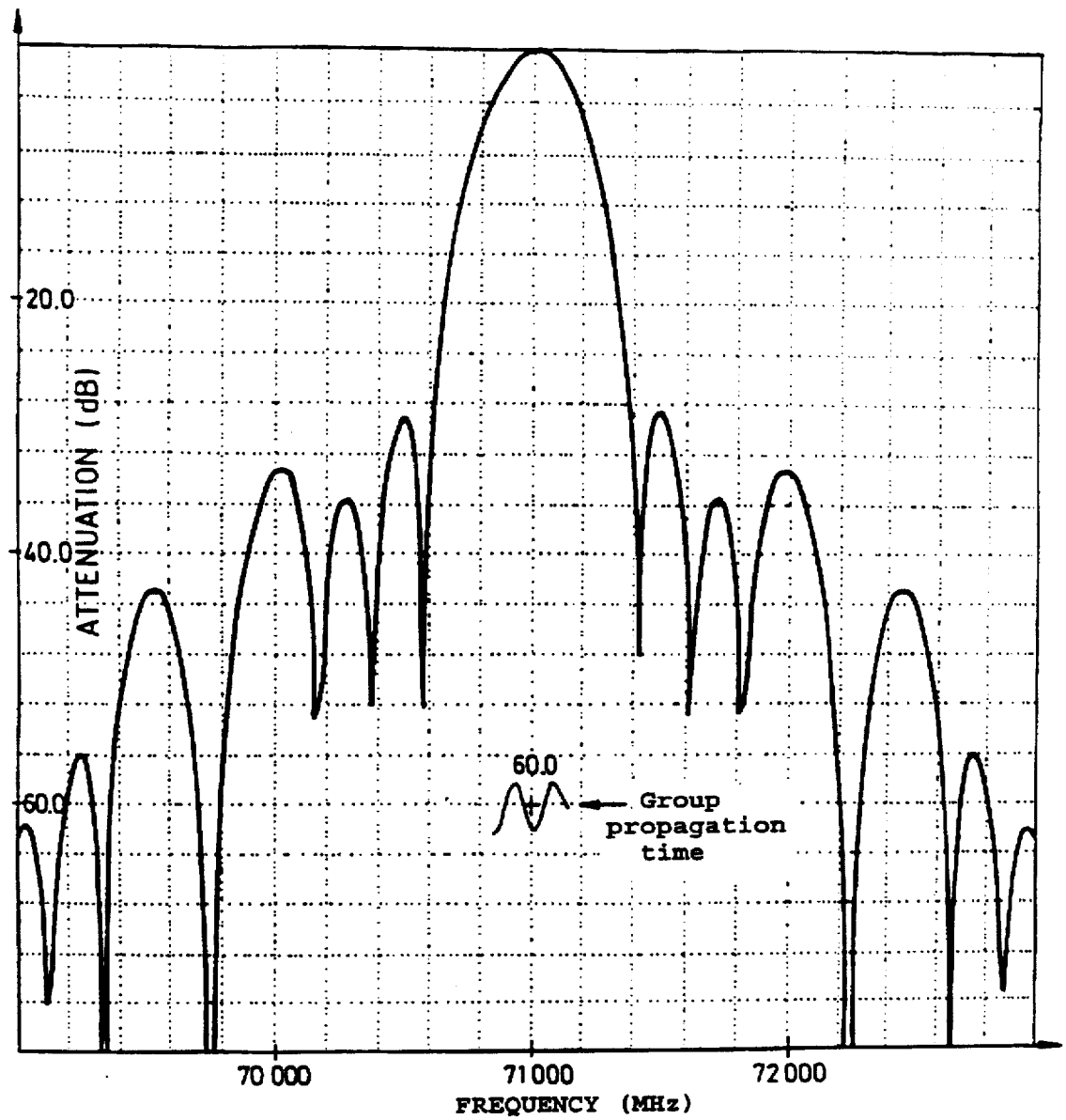
Figure 13:
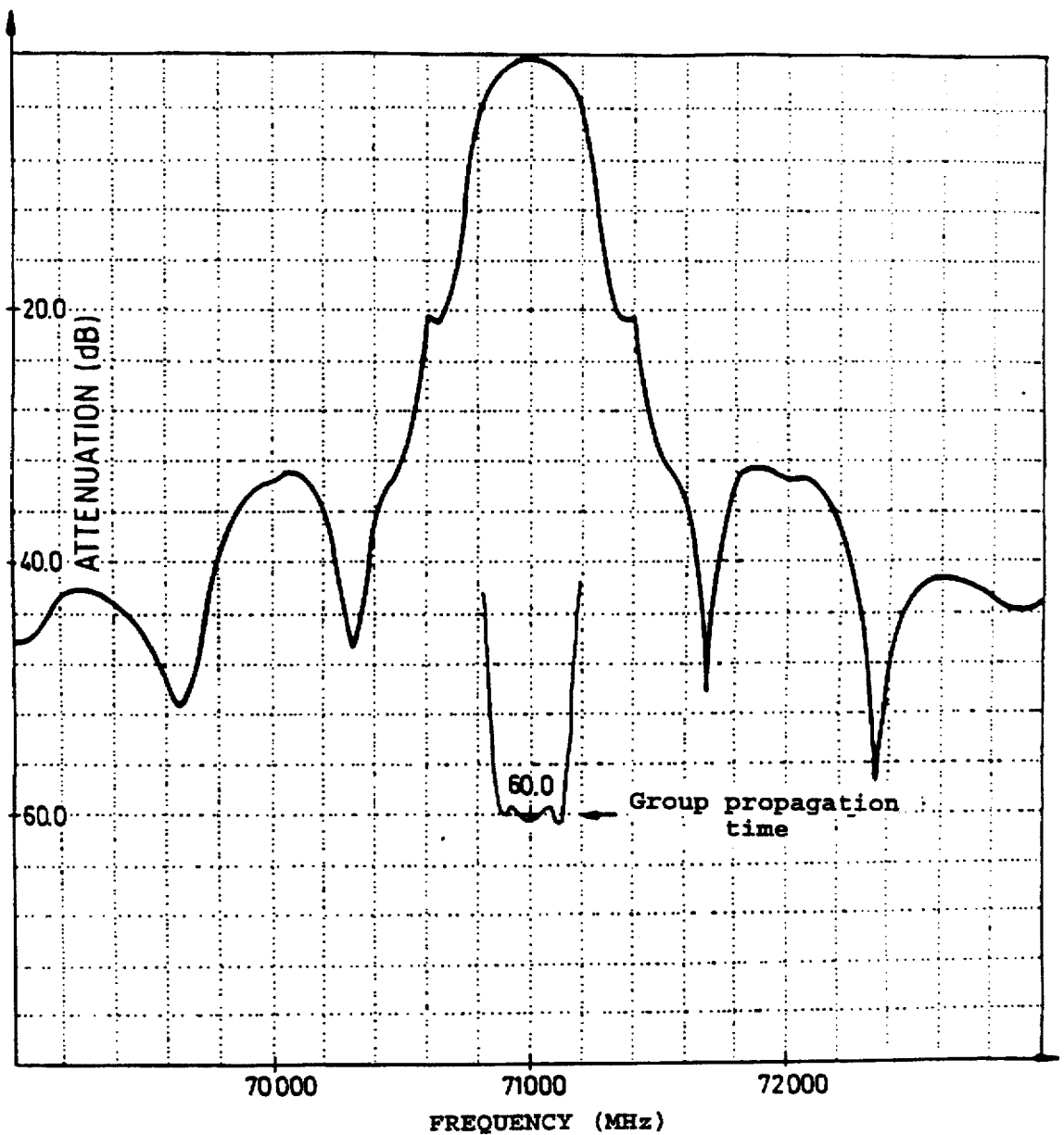

The curves of FIGS. 12 and 13 give respectively the plots obtained by simulation of the transfer function of a filter of 15 mm working length and without negative-reflection cells and of a filter of 11 mm working length with negative-reflection cells.

The attenuation of the filter, plotted on the axis of the ordinates in decibels, is given as a function of the frequency of the signal, expressed in megahertz along the axis of the abscissae.

The central operating frequency of the filters is 71 MHz.

The improvements in the technical characteristics essentially relate to the insertion losses which go from 7.4 dB for the filter according to the prior art to 6.5 dB for the filter according to the invention (these insertion losses not being depicted in the figures), the variation in the group propagation time which goes from 200 ns to 100 ns for the filter according to the invention, the decrease in level of the secondary lobes and the broadening of the passband.

In the case of emitting cells which include three electrodes of width $\lambda/6$ per wavelength and of reflecting cells which include two reflectors of width $\lambda/4$ per wavelength, the E and R cells are combined, according to another embodiment of the invention, in order to form the zone transitions as depicted in FIGS. 14, 15, 16 and 17 which correspond to the four cases possible.

In FIG. 14, the ER$^+$ER$^-$ transition for ε=+1 is obtained by a cell of width $2\lambda/3$ which includes two symmetrically placed electrodes of width $\lambda/6$.

In FIG. 15, the ER$^-$, ER$^+$ transition for ε=+1 is obtained by a cell of width $\lambda/3$ which includes an electrode of width $\lambda/6$ at its centre.

In FIGS. 16 and 17, the ER$^+$ER$^-$ and ER$^-$, ER$^+$ transitions for ε=−1 are obtained in the opposite way from previously.

We claim:

1. A surface-acoustic-wave transducer operating at a predetermined frequency for coupling electrical energy into acoustic energy on a substrate, said transducer comprising:

a substrate which supports propagation of surface-acoustic waves;

a plurality of interdigitated electrodes oriented on said substrate to convert input electrical energy into propagating surface-acoustic-waves on said substrate;

a first plurality of said electrodes being irregularly placed in at least one region of the transducer so as to enhance the reflection of acoustic energy in one direction, and a second plurality of said electrodes being irregularly placed in at least one further region of the transducer so as to enhance the reflection of acoustic energy in the opposite direction thereby resulting in local acoustic resonances within the transducer which serve to increase the coupling of the transducer over a limited range of frequencies, the position of said first and second plurality of irregularly placed electrodes being a function of a desired resonance frequency wherein said desired resonance frequency is said predetermined frequency, said electrodes being asymmetrically arranged whereby the acoustic energy is radiated from the transducer predominantly in a preferred direction.

2. The transducer according to claim 1, wherein the width of said at least some of said electrodes in at least one region of said transducer are different to enhance the reflection of acoustic energy in one direction and said transducer includes said at least one further region wherein the widths of at least some of the electrodes are different to enhance the reflection of acoustic energy in the opposite direction.

3. The transducer according to claim 2, wherein at least two of said electrodes which have a greater width have a center-to-center spacing of $k\lambda/2$ and at least two other electrodes of similar width have a center-to-center spacing of $l\lambda/2$ wherein said at least two greater width electrodes are offset from said two other electrodes by distance of $(2m+1)/4$, thereby forming a resonant cavity, wherein $\lambda$ is an acoustic wavelength corresponding essentially to the center frequency of operation of said transducer and k, l and m are integers.

4. The transducer according to claim 3 wherein each of said plurality of electrodes is connected to one of two busbars.

5. The transducer according to claim 3, wherein substantially all of said electrodes having a greater width are isolated from said busbars.

6. The transducer according to claim 3, wherein each of said electrodes are made of the same material.

7. The transducer according to claim 3 wherein said electrodes having a greater width have a width between $\lambda/4$ and $3\lambda/8$.

8. The transducer according to claim 7 wherein electrodes having a smaller width than said electrodes having a greater width have a width which is essentially $\lambda/8$.

* * * * *